US006943563B2

(12) United States Patent
Martens (10) Patent No.: US 6,943,563 B2
(45) Date of Patent: Sep. 13, 2005

(54) PROBE TONE S-PARAMETER MEASUREMENTS

(75) Inventor: Jon S. Martens, San Jose, CA (US)

(73) Assignee: Anritsu Company, Morgan Hill, CA (US)

(*) Notice: Subject to any disclaimer, the term of this patent is extended or adjusted under 35 U.S.C. 154(b) by 0 days.

(21) Appl. No.: 10/138,989

(22) Filed: May 2, 2002

(65) Prior Publication Data

US 2002/0196033 A1 Dec. 26, 2002

Related U.S. Application Data

(60) Provisional application No. 60/288,305, filed on May 2, 2001.

(51) Int. Cl.[7] .......................... G01R 27/28; G01R 35/00
(52) U.S. Cl. ....................................... 324/638; 324/601
(58) Field of Search ................................ 324/601, 612, 324/614, 623, 638, 76.19, 76.21, 76.22, 76.45; 702/85

(56) References Cited

U.S. PATENT DOCUMENTS 5,191,294 A * 3/1993 Grace et al. ................. 324/613
5,467,011 A * 11/1995 Hunt ............................ 324/67

OTHER PUBLICATIONS

Cacciola, J., "Direct Vector Analyzer Measurements of Class B and C Amplifiers," presented at Anritsu Technical Review Series, Jul. 1999.
Donecker, B., "Determining the Measurement Accuracy of the HP85 10 Microwave Network Analyzer," RF & Microwave Measurement Symposium, Oct. 1984, pp. 4–70.
Feher, K., Telecommunications Measurements, Analysis, and Instrumentation, Prentice–Hall, month missing 1987, pp. 318–321.
Gard, K. G., Gutierrez, H. M., and Steer, M. B., "Characterization of Spectral Regrowth in Microwave Amplifiers Based on the Nonlinear Transformation of a Complex Gaussian Process," IEEE Trans. On MTT, vol. 47, Jul. 1999, pp. 1059–1069.
Marks, R. B., "A Multiline Method of Network Analyzer Calibration," IEEE Trans. On MTT, vol. 39, Jul. 1991, pp. 1205–1215.
Mazumder, S. R., and van der Puije, P.D., "Two–Signal Method of Measuring the Large Signal S–Parameters of Transistors," IEEE Trans. On MTT, vol. 26, Jun. 1978, pp. 417–420.

* cited by examiner

Primary Examiner—Guy J. Lamarre
Assistant Examiner—James C Kerveros
(74) Attorney, Agent, or Firm—Fliesler Meyer LLP (57) ABSTRACT

An S-parameter measurement technique allows measurement of devices under test (DUTs), such as power amplifiers, which require a modulated power tone drive signal for proper biasing, in combination with a probe tone test signal, wherein both the modulated and probe tone signals operate in the same frequency range. The technique uses a stochastic drive signal, such as a CDMA or WCDMA modulated signal in combination with a low power probe tone signal. A receiver in a VNA having a significantly narrower bandwidth than the modulated signal bandwidth enables separation of the modulated and probe tone signals. VNA calibration further improves the measurement accuracy. For modulated signals with a significant power level in the frequency range of the probe tone signal, ensemble averaging of the composite probe tone and power tone signals is used to enable separation of the probe tone signal for measurement.

4 Claims, 7 Drawing Sheets

PROBE TONE S-PARAMETER MEASUREMENTS

CROSS REFERENCE TO PROVISIONAL APPLICATION

This application claims priority to provisional application SC/Ser. No. 60/288,305, entitled "Probe Tone S-Parameter Measurements" filed May 2, 2001.

BACKGROUND OF THE INVENTION

1. Field of the Invention

The present invention relates to measuring scattering parameters for a device under test (DUT), such as a power amplifier, which require that the DUT be operating with a modulated drive signal before accurate measurements can be made.

2. Description of the Related Art

The measurement of a device behavior under complex actual operating conditions has become increasingly desirable. In particular, it can be difficult to accurately measure gain and some reflection coefficients of a power amplifier operating under a realistic modulated signal drive. A small signal measurement alone of a power amplifier is generally incorrect since the DUT will not be biased correctly. A fully modulated measurement, however, may require very dedicated equipment, long measurement times for adequate stability, and special calibration techniques.

Figure 1:
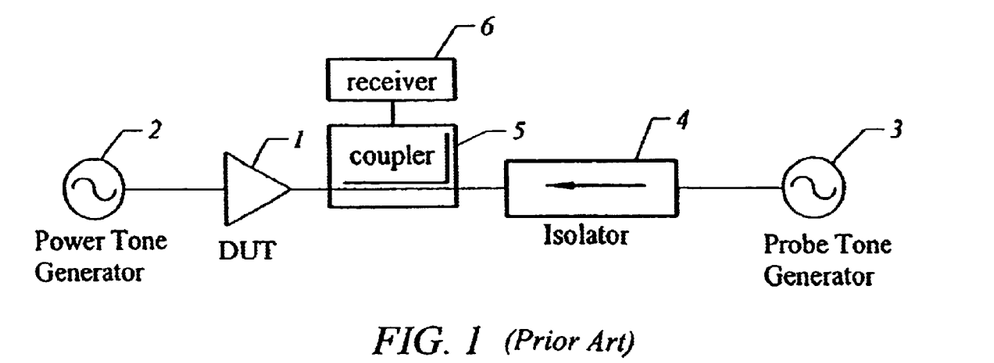
FIG. 1 a conventional test setup for hot S22 measurements of a DUT.

It has long been known that it is sometimes advantageous to make S-parameter measurements in the presence of other signals, as evidenced in S. R. Mazunder and P. D van der Puije, "*Two-signal Method of Measuring the Large Signal S-parameters of Transistors,*" IEEE Trans. On MTT, vol. 26, June 1978, pp. 417–420, incorporated herein by reference. Another method for taking measurements in the presence of other signals is the measurement technique termed the "Hot S22" technique. A typical test system setup for the Hot S22 technique is shown in FIG. 1. In the Hot S22 technique, the DUT 1 (usually a power amplifier) is driven to its normal operating point by a power tone signal provided from a power tone signal generator 2 to the input of the DUT 1, while a second smaller probe tone signal is provided to the output of the DUT 1 from a probe tone signal generator 3. An isolator 4 is sometimes provided between the probe tone signal generator 2 and the DUT 1 to keep DUT output power from affecting the probe tone signal generator 3.

Measurements are made from a coupler 4 connected between the second signal generator 3 and the output of the DUT 1. The coupler 4 provides a signal to a receiver 6 which downconverts the signal from the coupler to an intermediate frequency (IF) for measurement. The probe tone signal from generator 3, as reflected from the output of the DUT 1, is coupled by the coupler 4 to the receiver 6. The reflected signal is compared with the signal from the probe tone signal generator 3 to provide an output reflection coefficient measurement S22. Typically the signals from both the power tone signal generator 2 and the probe tone signal generator 3 are both sinusoids and are offset in frequency by at least several IF bandwidths to avoid effects on measurement due to interference between the power tone signal and the probe tone signal in the receiver, although this may not be necessary with specialized instrumentation to separate the signals based on phase behavior.

The Hot S22 measurements technique described are not typical load pull measurements, since the port impedances remain fixed. Without measurements for different loading, useful information about output reflection behavior and stability of the DUT, however, will still be provided for DUTs operating with 50 ohm loads in a 50 ohm environment. As such, the conventional Hot S22 measurement technique described is often used to characterize amplifier subassemblies rather than amplifiers alone.

Figure 2:
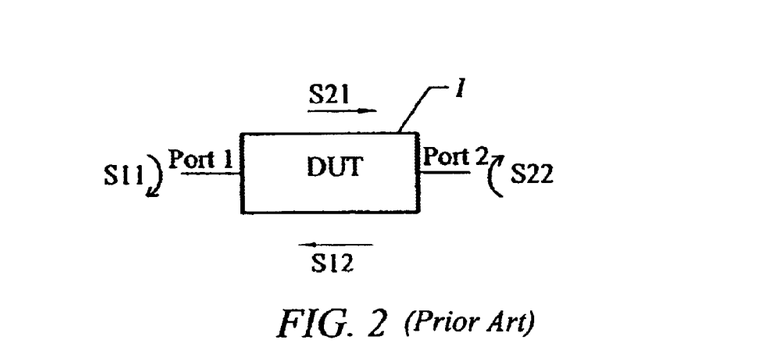
FIG. 2 illustrates S-parameters for a two port DUT.

The S-parameters of a two port device such as DUT 1 characterize how the device interacts with signals presented to the various ports of the device. The measurement for Hot S22 is, of course the S22 S-parameter. The first number following the S in "S22" indicates the number of the port the signal is leaving, while the second number is the port that the signal is being injected into. S12, therefore, is the signal leaving port 1 relative to the signal being injected into port 2. The four S-parameters associated with an exemplary two-port DUT are represented in FIG. 2, where:

S11 is referred to as the "forward reflection" coefficient, which is the signal leaving port 1 relative to the signal being injected into port 1;

S21 is referred to as the "forward transmission coefficient, which is the signal leaving port 2 relative to the signal being injected into port 1;

S22 is referred to as the "reverse reflection" coefficient, which is the signal leaving port 2 relative to the signal being injected into port 2; and S12 is referred to as the "reverse transmission" coefficient, which is the signal leaving port 1 relative to the signal being injected into port 2.

Figure 3:
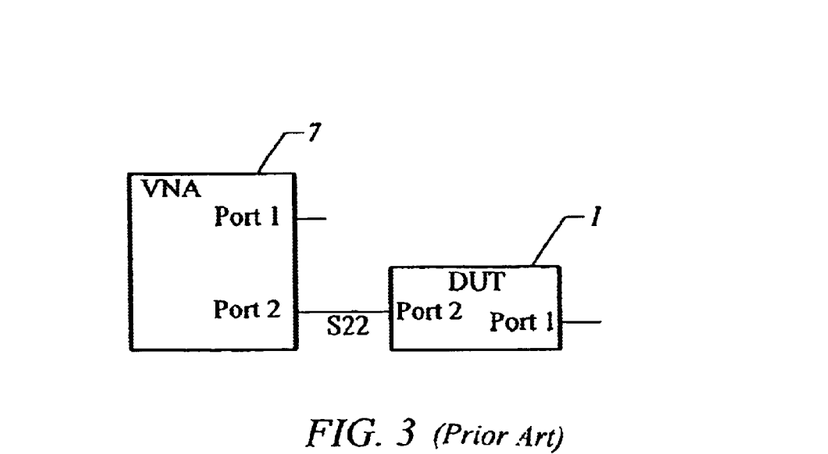
FIG. 3 illustrates measurement of parameters of a two port DUT using a two port VNA.

An important point about the Hot S22 measurements is that they can be made with a calibrated vector network analyzer (VNA) 7, as illustrated in FIG. 3. The VNA is calibrated to remove uncertainties and provide traceability. With straight power measurements using a scalar test setup, such as with the signal generator 2, coupler 5 and receiver 6, rather than the VNA 7 used to make measurements, uncertainties will not be removed.

In a modem measurement environment with a variety of wide modulation formats and highly optimized power amplifiers, the need for performance data increases. For instance, other S-parameter measurements than S22 might be desirable, since all results under large signal sinusoidal drive or some other type of drive may not be the same. As an example, forward parameters may be affected as well as reverse parameters. Furthermore, a modulated power drive other than large sinusoidal signals might be desirable since average compression behavior of components in the receiver varies as a function of the statistical distribution of an input signal. More common modulation signals such as code division multiple access (CDMA) and wideband CDMA (WCDMA) may be desirable.

SUMMARY

In accordance with the present invention, a method and apparatus is provided to test (DUTs), such as power amplifiers, which require a modulated drive signal for proper biasing, in combination with a probe tone test signal, wherein both the modulated and probe tone signals operate in the same frequency range.

In accordance with the present invention, a stochastic power tone modulated drive signal, such as a CDMA or WCDMA signal, is provided in combination with a low power probe tone signal. The probe tone signal has a power significantly less than the modulated power tone signal to avoid further compression of the DUT, and so that a statistical average of a combined probe tone signal and power tone signal does not change significantly from the average of the power tone signal alone. A narrowband receiver having an IF measurement bandwidth significantly less than the overall power tone signal bandwidth enables separation of the modulated and probe tone signals. Test signals are provided using a VNA, and calibration is used to further improve the measurement accuracy. For modulated power tone signals with a significant power level in the frequency range of the probe tone signal, ensemble averaging of the modulated signal over a wide signal frequency range is used to enable separation of the probe tone signal for measurement.

BRIEF DESCRIPTION OF THE DRAWINGS

Further details of the present invention are explained with the help of the attached drawings in which.

DETAILED DESCRIPTION

A. Test Method

Without specialized measurement instrumentation, previous measurement techniques required that the multiple signals provided to the DUT be separate in frequency space. For more stochastic natured modem modulation power tone drive signals, such as CDMA and WCDMA, measurements can be made with the separation restriction removed if:

a. The probe tone is sufficiently small that the statistics of the composite signal including the probe tone and power tone signals, are not significantly different from the modulated power tone signal alone. The probe signal must, or course, be large enough that the signal-to-noise (S/N) ratio in the measurement device receiver is adequate to distinguish the probe tone signal from noise; and b. The use of a narrowband receiver along with the ensemble averaging allows a measurement of the probe tone while excluding the modulated signal from the measurement receiver.

To make these improved probe tone measurements of value, vector network analyzer (VNA) calibrations are used to make the measurements more accurate than conventional probe tone measurement techniques made with scalar devices rather than a VNA. Further, with a receiver having a large dynamic range, power levels manipulated correctly, and a standard VNA calibration, a significant improvement in measurements can be made. Indeed dynamic range is somewhat easier to achieve with a narrowband receiver in that large amounts of the composite signal power distributed over a wide range are automatically excluded from the receive path.

The improved probe tone measurement techniques will be described generally herein since the technique has broad applicability. Examples using the improved measurement technique will largely focus on a special measurement case: two port devices where the composite stimulus is composed of a continuous-wave (CW) probe tone signal plus some modulated power tone signal of significant bandwidth relative to that of the measurement system.

The improved probe tone S-parameter measurement is characterized by the following:

1. Any number of ports of the DUT may be driven by a signal and there may be any number of signals driving a given port.

2. One of these signals, designated the probe tone signal, will be the basis of a direct S-parameter measurement. It will generally be CW.

3. The probe tone signal power will be small relative to the total power level at the port being measured (port in question). Small is defined as the probe tone having only a quasi-linear impact on DUT performance and a negligible effect (relative to other uncertainties) on the total signal statistically at the port in question.

4. If any signals being combined with the probe tone are also CW, they may not be at the same frequency as the probe tone and generally must be separated by at least a bandwidth of the test measurement receiver. If the other power tone signals are modulated (and sufficiently stochastic), they may coexist in the same frequency range.

5. The composite power delivered to the receiver must not alter its linearity state (although the DUT state can, or course, be a function of composite power).

How the improved measurement is made is next defined. Generally, the receiver channels will get a combination of the probe signal and some other power tone signals. The general S-parameter is defined as an output wave ($b_n$, transmitted or reflected) ratioed against the incident wave ($a_m$, a.k.a. the reference). Historically, these waves have been assumed to be measured at a single frequency, but with receiver bandwidth affecting this measurement a new concept will be generalized by defining an S-parameter term $S_{mn}$ as follows:

$$S_{mn} = \left[\frac{g(b_n)}{g(a_m)}\right]_{state1} = \left[\frac{\int b_n(f)\Delta(f-f_p)df}{\int a_m(f)\Delta(f-f_p)df}\right]_{state1}. \quad (1)$$

Where g represents the complete receiver behavior which is defined by a convolution with the change in frequency Δ. The extent of Δ is limited by a narrow IF filter. $f_p$ is the probe tone center frequency (to which the receiver is tuned), and state 1 describes the power state that the device/system is operating under (the dependence on power state is significant). The waves $b_n$ and $a_m$ represent the composite test signal ($b_n$ received from the DUT at port n) and the composite reference signal ($a_m$ generated by the power tone source at port m). If one can assume that b and a do not change over the frequency span defined by Δ (which can practically be as small as a few Hz), then the definition reduces simply to the familiar:

$$S_{mn} = \left[\frac{b_n(f_p)}{a_m(f_p)}\right]_{state1} \quad (2)$$

If the combined signal includes the probe tone signal plus additional CW signals, then the measurement process is complete since the IF filter will presumably remove all of the other signals. If the combined signal includes a modulated signal that has no significant energy at the frequency of the probe signal, then the measurement process is complete for the same reason.

Alternatively, the case of the modulated power tone signal having significant energy at the probe tone frequency with the signal $a_m$ changing rapidly over the scale of Δ due to a modulated power tone signal ($a_m$ is a sum of the probe tone, $p_m$, and a modulated power tone signal, $d_m$). In this case, some additional averaging must be considered to make the measurement tractable. Presumably Δ can be made narrower (often digitally) using a mathematical process termed averaging beyond a certain point (say 1 Hz wide Δ as an example, although Δ can be other values as in subsequent examples presented herein). This averaging may be sweep-to-sweep or point-to-point as long as the sampling process is statistically independent of the modulated power tone signal $d_m$. If $d_m$ has zero mean, it is independent of the sampling process, and hence can be removed by sufficient ensemble averaging, then $$<\int a_m(f)\Delta(f-f_p)df> \approx p_m(f_p) \quad (3)$$

Note that this does not say $d_m$ has zero power, just that the complex valued function has zero mean in the frequency range of interest. The 'approximately equal' is used to denote a trade-off between resulting data jitter and the amount of ensemble averaging performed; it converges to an equality in the limit of high averaging. Note that standard IS-95 CDMA and 3GPP (among others) WCDMA waveforms fit this criteria; it is expected that many other standards do as well. If a variant of equation 3 holds for $b_n$ (a and b will generally be of the same type), and we define $b_n$ as the sum of a received probe tone portion, $q_n$, and received power tone portion, $e_n$, then:

$$\langle S_{mn}\rangle \approx \left[\frac{q_n(f_p)}{p_m(f_p)}\right]_{state1} \quad (4)$$

Since p and q, probe tone values, are defined to be small enough to not affect DUT state (quasi-linearity assumption), then equation 4 still represents a small-signal quantity although it is restricted to a defined operating state of the DUT. This allows full S-parameter analysis to proceed and is a key point. Such analysis is conceptually more difficult with the more traditional large signal S-parameters (in which the probe tone is the only signal and is large) since any quasi-linearity claims would be difficult to justify.

The practical uncertainties introduced by this process are primarily limited to the residual quasi-random nature of a and b after a finite amount of ensemble averaging. Preferably, sufficient ensemble averaging is performed relative to the base measurement uncertainty as described in B. Donecker, "*Determining the measurement accuracy of the HP8510 Microwave Network Analyzer,*" R F & Microwave Measurement Symposium, October 1984, pp. 4–71), incorporated herein by reference. Practical uncertainties may be elevated compared to traditional measurements if the probe tone powers are low enough to meet the statistical insignificance criteria.

For this improved measurement technique, standard VNA 12-term calibrations can be performed at the probe tone center frequency $f_p$ and the actual calibration steps can be performed with only the probe tone present. As such, the standard calibration-related uncertainty terms (corrected port match, directivity, and tracking) will be unaffected. This measurement is not specific to a given calibration technique (Short-Open-Load-Thru, variations on Thru-Reflect-Line, etc.).

When applying the calibration, the coefficients still apply as long as equation 4 holds and one assumes the summed signal does not generate significant non-linearities in the receiver. Subject to receiver compression levels and sufficient ensemble averaging, there should be no increase in calibrated uncertainties over that in the base measurement. As stated previously, this compression risk is perhaps not as great as might be imagined since the bulk of the incident power is outside the bandwidth of the receiver function and hence will not contribute as much to compression as in a wideband receiver. Note that it is the S/N established by the probe tone in the receiver that is the relevant component to be used in the uncertainty computations. The key point is that since the standard calibration procedures, the uncertainty calculations, and the small signal measurement characteristics all hold, measurement integrity and traceability should be maintained.

B. Test System Description

Figure 4:
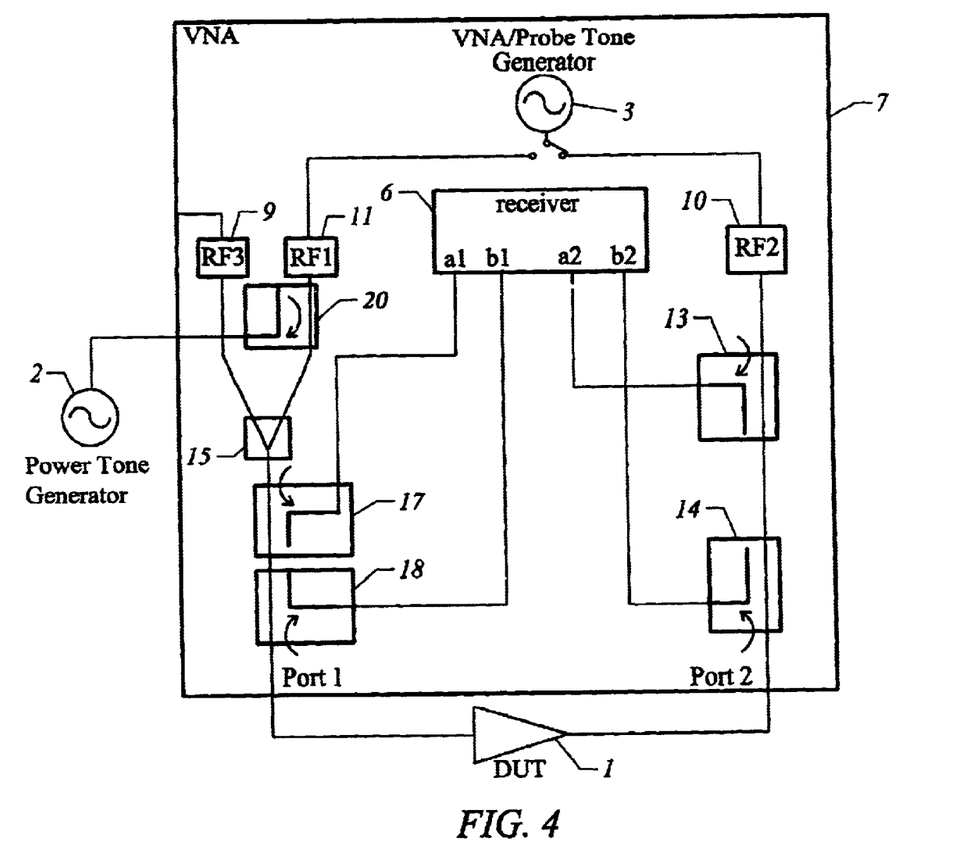
FIG. 4 shows test system configuration for making probe tone S-parameter measurements using the method of the present invention.

FIG. 4 shows test system configuration for making measurements in accordance with the improved probe tone S-parameter measurement technique of the present invention. The system includes a VNA 7 with some internal components shown to illustrate the preferred components for use in making measurements according to the present invention. An example of a VNA which includes the components shown is the Anritsu MS4623CVNA, manufactured by Anritsu company of Morgan Hill, Calif. The VNA 7 can be calibrated using a calibration kit, such as the Anritsu 3750LF. Although these specific instruments are shown and described, other VNAs and calibration kits might be used.

Attached to an external port of the VNA 7 is a signal source 2 for generating the power tone signal. Also, connected to the external test ports, Port 1 and Port 2, is a two port DUT which requires a modulated drive signal for accurate measurements to be made. Internal to the VNA is a signal source 3 for generating a measurement test signal, and which will be used to generate the probe tone signal required for measurements in accordance with the present invention. The probe tone signal source 3 is connected by a switch to connection units 10 and 11 to provide the probe tone signal to one of two signal connection terminals providing signals labeled RF1 and RF2. An external signal can be applied to the VNA 7 to a connection unit 9 to create a signal RF3. Although shown as an external connection, a separate signal source could be included in the VNA 7 and be connected to unit 9 to provide the RF3 signal.

A receiver 6 is connected to receive signals incident and reflected from the test ports Port 1 and Port 2 to enable S-parameters to be calculated for the DUT 1 connected between the test ports. Coupler 13 couples the RF2 signal incident to Port 2 to the receiver port a2. Coupler 14 couples a reflected signal from port 2 to the receiver port b2. The RF1 and RF3 signals are combined in power combiner 15 to provide a test signal to Port 1. Coupler 17 couples the RF1 and/or RF3 signal incident to Port 1 from combiner 15 to test port a1 of the receiver 6. Coupler 18 couples a reflected signal from Port 1 to test port b1 of the receiver 6.

A directional coupler 20 couples the power tone signal from the external power tone signal source 2 to be combined with the probe tone RF1 signal. The diagram in FIG. 4 uses a directional coupler 20, but as an alternative, the power tone signal generator 2 could be connected to the connection unit 9 to form the signal RF3 and be combined in the Wilkinson-class combiner 15 with the probe tone signal RF1 from generator 3 with relatively low insertion loss and some isolation. The choice of a coupler or Wilkinson-class combiner for combining the probe tone and power tone signals will be dictated by the amount of reverse power from the power tone signal source 2 into the probe tone signal source 3 that the VNA can tolerate, as well as by the drive requirements of the DUT. If the isolation of the coupling device 20 is poor, enough energy may be returned to the VNA port to disturb the function of its automatic leveling circuitry. This is balanced against the amount of modulated power required to bias the DUT 1 into its desired operating state.

Note in FIG. 4 that the combining of the power tone signal with the probe tone signal accomplished by coupler 20 is done prior to the reference couplers 17 and 18. This implies that the modulated signal will be present in both numerator and denominator ($a_1$ and $b_1$) of an S-parameter calculation. An important advantage of this is that the stochastic nature of the data will at least partially cancel (one of the general benefits of the ratioed measurement although it is usually used to reduce the effects of thermal noise, not noise-like modulation), thus reducing the amount of averaging required in the method of the present invention. The degree of cancellation will be dependent on the coherence between the reference and test channels and, hence, on the path length difference in the VNA 7 between these two channels (receiver channel $a_1$ vs. $b_1$). In most configurations, this path length difference is less than 10 ns. With current bit times of at least 100 ns (for 10 Mbps) in personal communication systems, one can normally expect a high degree of coherence and hence cancellation. If higher bit rates are required and coherence falls, equalizing line lengths can be used to decrease the path length difference.

The IF bandwidth (IFBW) of the receiver 6 will normally be set to a low value although, depending on receiver architecture, it can be widened to improve speed. The trade-off for the increased speed is that the amount of required ensemble averaging for the present invention will then increase. Preferably, the sampling and averaging process of the present invention must be statistically independent from the modulated signal. Normally this is not an issue when uncommon clocks are used to drive the power tone generator 2 and probe tone generator 3, but it can interfere with the measurement in unusual cases. Smoothing, or boxcar averaging, can be an acceptable substitute for ensemble averaging if the macro DUT response is not changing in frequency over the range of interest. If it is changing, then the frequency resolution will decrease.

In order to accommodate power requirements for the probe tone signal generator 3, the probe tone source power of approximately −15 dBm may be employed for a target DUT that requires 0 dBm to be biased into the desired state. Assuming classical coupling coefficients of about 20 dB, one can compute an uncertainty of about 0.03–0.05 dB for $|S21|$ above about −40 dB (ignoring compression). Since the target DUT is most likely a power amplifier, this constraint is of no relevance. The main effect of lowering the probe tone power is to bring up the $|S21|$ level at which uncertainty starts to degrade.

The next issue is setting the power level for the probe tone signal relative to the power tone signal. A critical point is that the behavior of the power tone signal in the presence of the probe tone signal must not change in the sense of S-parameters, which are fairly macro-level measurements of a DUTs performance (the criteria would be much tighter if, for example, the measurement was a bit error rate or error vector magnitude as opposed to S-parameters). The criteria for S-parameter measurements can be described as follows:

1. The average power resulting from application of the probe tone signal to the modulated signal should not substantively increase. This is important so that the DUT does not experience compression, or does not experience further compression if compression in the current bias condition is occurring. There are many possible thresholds for composite power level change, but a 0.2 dB maximum is preferable since it is primarily S-parameters that are measured with the present invention and not more hyper-sensitive parameters. This 0.2 dB level is also smaller than the typical measurement uncertainty of average power.

Figure 5:
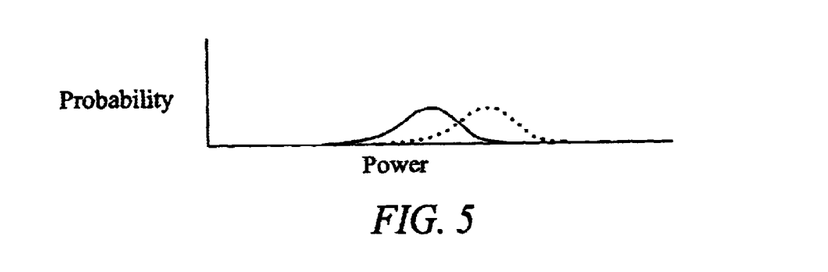
FIG. 5 plots a composite signal power distribution vs. frequency probability with (dotted) and without (solid) a probe tone signal component.

2. The composite statistics of the waveform with the probe tone added further should not substantively change. Again the intent here is to avoid altering the compression behavior of the DUT. Since at a given frequency a constant power is added, the statistics themselves are not changing; just the mean is shifting as illustrated in FIG. 5. FIG. 5 plots the composite signal power distribution vs. frequency probability with (dotted) and without (solid) the probe tone signal component. Note that the probe tone signal does not alter the overall statistics, except it moves the mean at a given frequency. Thus the peak power and the amount of time the device spends above a certain level is not changing except that level is shifted to a higher power. For this argument, the conditions above are resorted to—that if this shift is small enough, it will not affect the parameters being analyzed. In an older measurement system, one may want to make sure that the peak to average ratio does not change substantively, but more modern components assure this is the case. It is easy to show that if the average power has changed less than x dB for a probe tone of $P_A$, then the peak to average ratio will have changed less than x dB as well. Let $P_a$ be the initial average power, $P_A$ be the probe tone power, $\epsilon(>1)$ be the allowed ratio of new average power to old average power. By definition $$\frac{P_a + P_\Delta}{P_a} \approx \varepsilon \quad (5)$$

Let C be the old peak to average ratio (crest factor), then the new crest factor is $$\frac{CP_a + P_\Delta}{P_a + P_\Delta} \quad (6)$$

Since C>1 and $P_\Delta$>0, this ratio will always be smaller than C. Thus R, the ratio of the old to the new crest factor (to keep R>1 without loss of generality), is given by $$R = C\frac{P_a + P_\Delta}{CP_a + P_\Delta} = \frac{P_a + P_\Delta}{P_a + \frac{P_\Delta}{C}} = \varepsilon \frac{1}{1 + \frac{P_\Delta}{CP_a}} < \varepsilon \quad (7)$$

The inequality approaches an equality as C and/or $P_a$ gets large. Thus if one meets the average power criteria, one automatically meets that same criteria for crest factor. For a 0.2 dB maximum variation with the probe signal added, this requires that the probe tone power level be at least 13.3 dB below the starting average power. If other levels than 0.2 dB maximum are desired, the probe tone power level will likewise change from 13.3 dB. For signal to noise in the receiver and to minimize measurement time, it is generally desirable to get the probe tone signal power relatively close to this level.

C. Test Measurement Examples

Example test measurements will next be discussed, where the measurements use the test setup of in FIG. 4. The probe tone signal used will be a sinusoid generated internally by signal source 3 of the VNA 7, while the modulated signal will be an IS-95 CDMA signal (chip rate 1.2288 Mcps, 9 forward channels). The modulated signal is injected from power tone source 2 using the coupler 20. The power levels vary in the different examples but a 15 dB offset between modulated power tone signal and probe tone signal power is maintained (with the exception of one example to show the effect of high probe powers). Receiver linearity is discussed only in the first example but it was verified in all examples.

Figure 6:
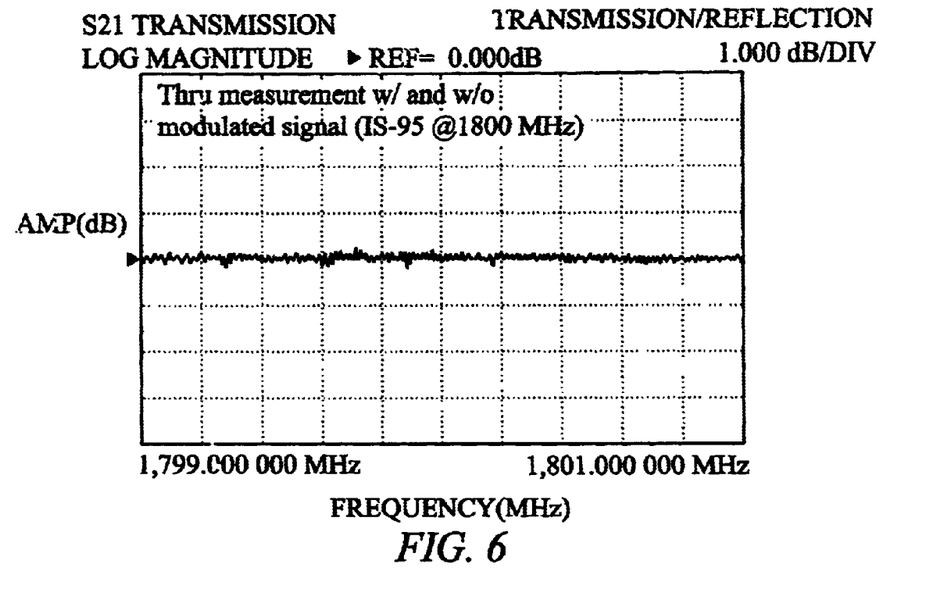
FIG. 6 shows VNA measurements of S21 for a thru line for both a probe tone signal composite signal (probe tone and power tone)

In the first test measurement shown in FIG. 6, an |S21| measurement of a thru line is provided with the probe tone and with an IS-95 modulated power tone signal with a center frequency at 1800 MHz. The bandwidth of the modulating signal is about 1.25 MHz, so a sweep range from 1799 MHz to 1801 MHz is shown. Two test measurements are shown, one with the composite (probe tone and power tone) signal, and the other with the probe tone signal separated out. The jitter on the data is a little higher than what one would normally expect since the resulting reference power is quite low. This could be improved by adding reference amplification or increasing averaging (although the latter will have an attached speed penalty). Since the amount of jitter is roughly equivalent with and without the modulating signal, one can conclude that the receiver is effectively filtering the modulated energy, even with the composite signal (where the probe tone is still embedded), illustrating that the IS-95 easily meets the conditions of being sufficiently stochastic. Since the mean did not move, we can be reasonably sure that the receiver is not being compressed.

Figure 7:
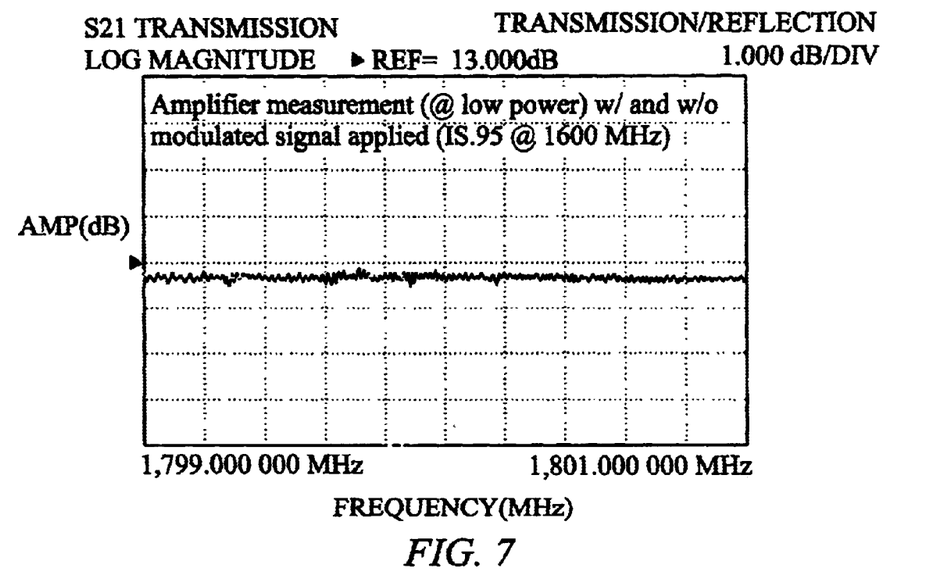
FIG. 7 shows VNA measurements of S21 for a small signal amplifier for both a probe tone signal and a composite signal.

In another example shown in FIG. 7, |S21| measurements are again shown, but this time with the DUT being a small signal amplifier. As in FIG. 6, in FIG. 7 one measurement is made with the composite signal, and another with the probe tone signal separated out. Further, VNA calibration is used for both measurements. The composite power level required for the small signal amplifier is low, so the same signal grouping and powers used in FIG. 6 are used in FIG. 7 so that the DUT amplifier will not be heavily compressed. As one might expect, the traces nearly overlay. The slight suppression in the mean with the modulated signal suggests the onset of compression, but by an amount less than 0.1 dB. Note that for many larger signal power amplifiers, this display would be quite different since the gain is a function of drive level over a large range. This particular DUT has flat gain up until its compression behavior starts at about a −3 dBm input.

Figure 8:
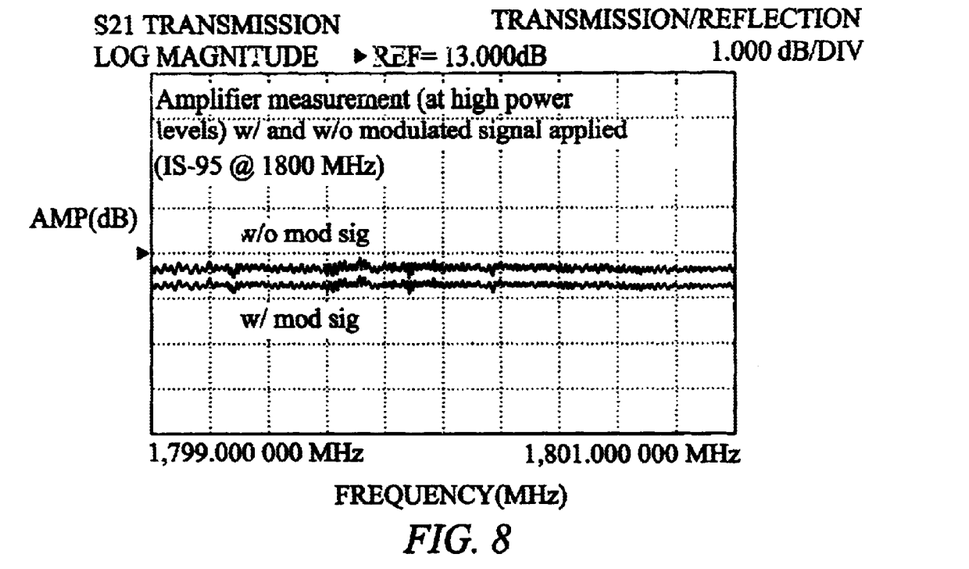
FIG. 8 shows S21 measurements of a small signal amplifier similar to FIG. 7, but with power levels increased where the DUT is in compression.

In another example shown in FIG. 8, |S21| measurements are again shown with the DUT being a small signal amplifier, as in FIG. 7, but with increased input signal power so that significant DUT compression is occurring. The same power delta of 15 dB was maintained but the modulated signal power is increased. The lower trace in FIG. 8 represents the gain of the amplifier with this level of modulated drive signal. It is quire clear that |S21|, as expressed by the probe tone measurement, is suppressed upon application of the higher modulated signal. While this should not be surprising it is a key point of this measurement.

The 0.4 dB of compression from the small power signal behavior of FIG. 7 is quite clear in FIG. 8, and the level of jitter again does not differ much with and without the modulating signal. It is interesting to note that the level of compression is the same whether the modulated energy and probe tone overlap in frequency or not (recall the IS-95 signal has about 1.25 MHz of bandwidth in this sweep from 1799 MHz through 1801 MHz). Partially this is a result of the use of a wideband amplifier DUT for this test (4 GHz) and the fact the modulated power signal is globally changing the bias state of the device.

Figure 9:
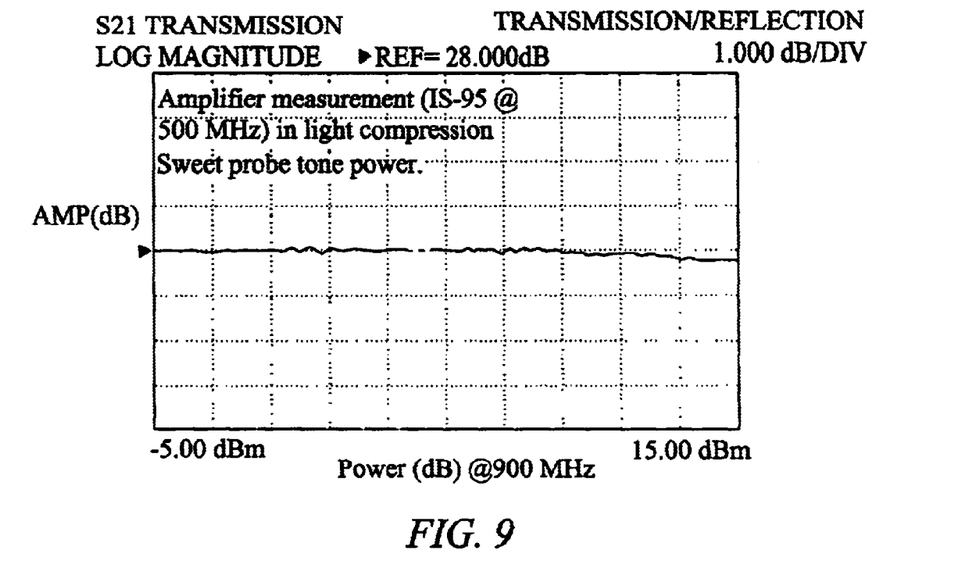
FIG. 9 shows S21 measurement from an amplifier as probe tone power is increased and the modulated power signal remains fixed.

FIG. 9 illustrates the effects of amplifier compression on the measurements in accordance with the present invention to examine the effect of applying probe tone power in excess of what is recommended. FIG. 9 shows |S21| of an amplifier in about 0.2 dB compression from the applied IS-95 signal as the probe tone power is increased and the modulated power signal remains fixed. The measurement changes composite power levels from −5.0 dBm to 15 dBm while measuring S21 power. The input probe tone power varies here from 25 dB below the modulated power (−5 on the x-axis) to about 5 dB below the modulated power (+15 on the x-axis). The recommended maximum operating point of 13.3 dBm occurs at the center of the x-axis between the −5 dBm and 15 dBm points. As one can see, the degradation of data is not obvious until well above this threshold. Note that the error is on the order of 0.15 db at the worst case point of 15 dBm on the x-axis. The worst case shown in FIG. 9 is demanding since the DUT has entered compression and helps justify the power levels used.

Figure 10:
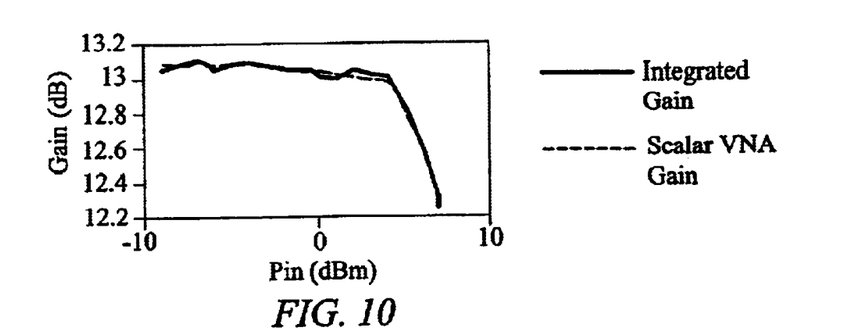
FIG. 10 shows a comparison between measurements made using the improved probe tone technique of the present invention and a more conventional scalar approach.

FIG. 10 illustrates a comparison of measurements made using the improved probe tone technique of the present invention, with a more conventional scalar approach of modulated gain measurements, as illustrated in FIG. 1. For the scalar technique, measurements were made using a spectrum analyzer with an integrating function. The spectrum analyzer was used to measure input and output power (or Gain) (integrating over 2 MHz with a 30 kHz bandwidth) of an amplifier as a function of drive signal power level (Pin) level. The same measurement was performed using the probe signal approach of the present invention while maintaining a 15 dB power delta between the probe and power tone signals, and sweeping the composite power levels. The same modulated IS-95 signal was used for both measurements but, of course, the probe tone was not present for the integrated spectrum analyzer measurement. The results span the range of small signal to heavily compressed and hence should represent a reasonable cross section of DUT behaviors. The results show good agreement between the conventional scalar measurement, and the vector measurement of the present invention.

Having established a certain level of agreement with scalar results, conventional vector measurement techniques are compared. The simplest of the class of vector probe tone measurements is Hot S22 in which a full 1 port calibration is used, as illustrated in FIGS. 1 and 2. In this measurement, unlike measurements with the present invention, an offset sinusoid is applied to the DUT input and a probe tone is bounced off the DUT output. Further, as in conventional measurements, there is a frequency offset between the probe and power town signal of several receiver bandwidths (300 kHz >>1 kHz IFBW for FIG. 11). The vector calibrations provide correction for port matches, directivity and tracking to reduce the measurement uncertainty in this case to about 0.2 dB, considerably better than that of a scalar measurement (uncertainty >0.5 dB typically) and more stable.

Figure 11:
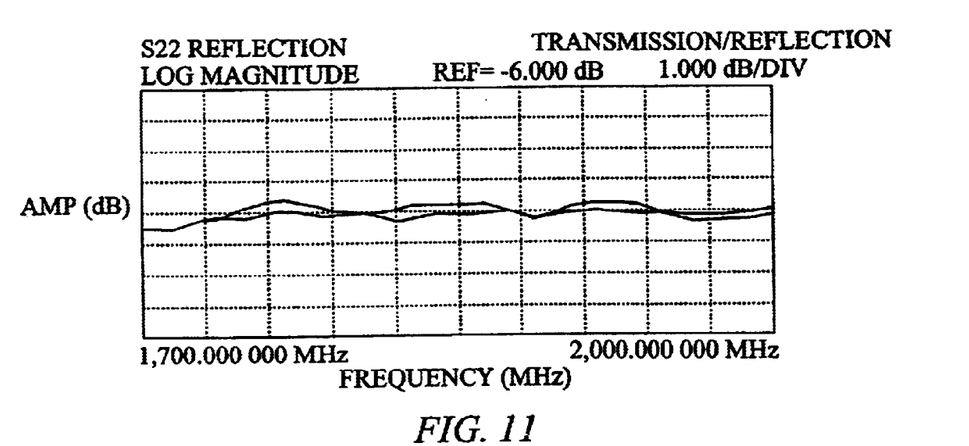
FIG. 11 shows conventional vector measurement techniques made with and without the DUT in compression.

An example measurement is shown in FIG. 11 at small signal and modest compression drive levels. The difference between the measurements is quite noticeable. The important point about this measurement is that it uses full vector correction of the reflection measurement. The uncertainties are much lower (<0.1 dB) and more stable than what one could obtain with a scalar measurement.

Figure 12:
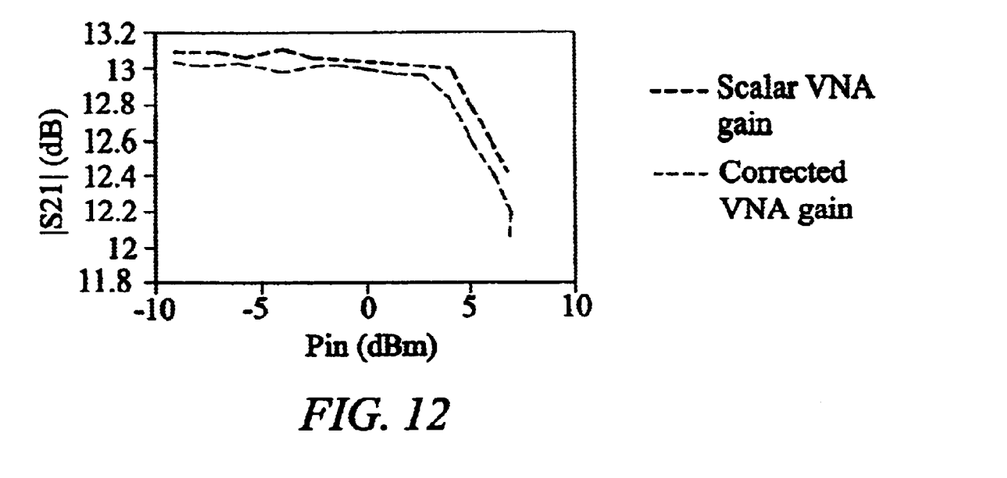
FIG. 12 shows a comparison between scalar and vector measurements.

Comparison of vector and scalar measurements are shown in FIG. 12 to illustrate the benefits of vector measurements. On a gain measurement, for example, the obvious benefit of vector measurements is correcting for raw port matches. In other measurements, directivity and vector tracking errors can also be effectively corrected which will not happen in a scalar measurement. This issue becomes more important as the DUT approaches compression since its impedance levels will be changing. In FIG. 12, the differences are under 0.1 dB at low power levels (Pin), but at higher power levels, the differences increase, such as to 0.3 dB at a 7 dBm power level. The difference at up to about +4 dBm input power, being under 0.1 dB is likely due to source match-S11 interactions possibly together with a better tracking term characterization. The difference of 0.3 dB at 7 dBm, however, is well beyond the measurement uncertainty of about 0.07 dB (for the vector corrected data) and can be considered significant from a measurement point of view.

Figure 13:
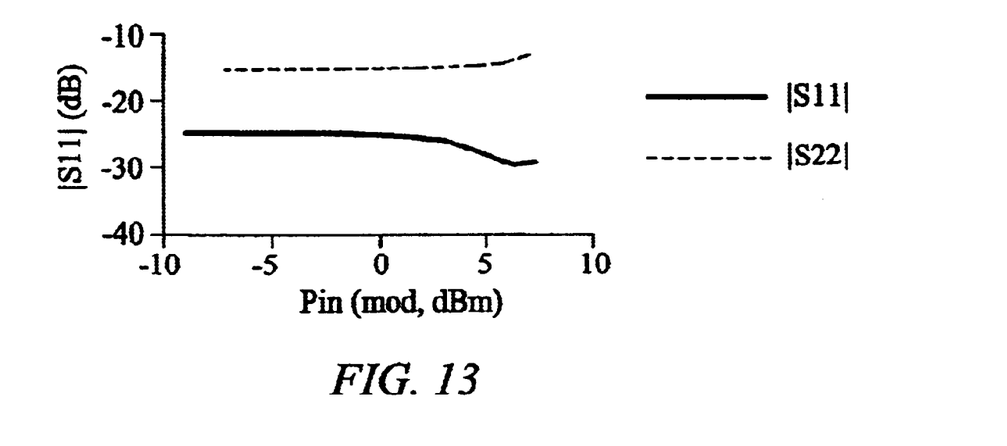
FIG. 13 illustrates the effects of an impedance mismatch between the test signal port and the DUT.

FIG. 13 illustrates the effects of an impedance mismatch between the test signal ports and the DUT. Effects are shown for an input mismatch (S11) and an output mismatch (S22). As shown, the measurement deviation increases as a function of power level. These parameters were measured using a full 12 term probe tone calibration. While the input match is actually improving with drive, the output match is definitely not. The effects of a mismatch between measurement system and DUT will increase at these higher power levels and lead to increased scalar measurement errors.

In a final example, measurements are made using a 900 MHz handset variety power amplifier as a DUT. This amplifier exhibits gain expansion for a wide range of input powers, a gain flattening near the desired operating point and finally gain compression. As such, a measurement like that in FIG. 7 requires careful interpretation since the DUT gain will be lower with probe tone alone compared to the composite signal. The probe tone measurement is still quite valid but the DUT operating point will be strictly established by the modulated signal and must be carefully considered.

Figure 14:
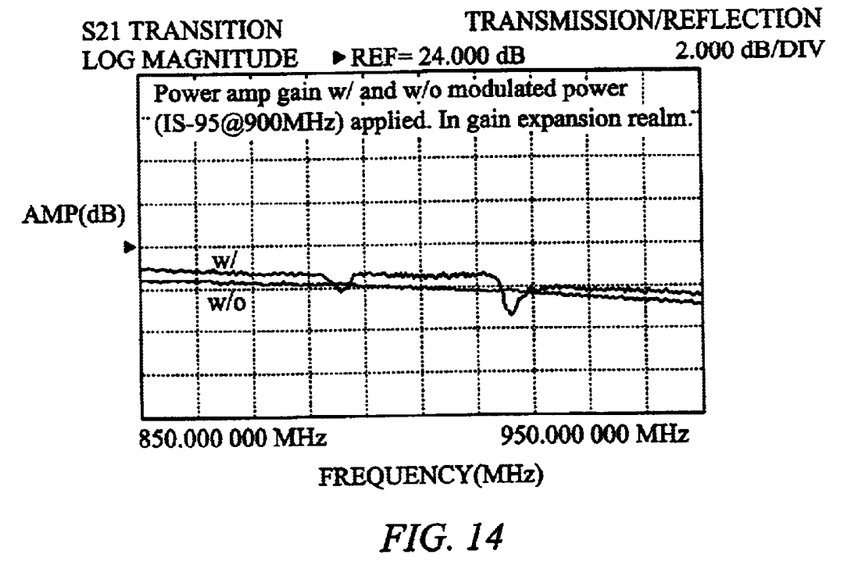
FIG. 14 shows a plot of gain for a power amplifier with and without modulation power to illustrate profiling.

FIG. 14 shows a plot of gain with and without modulation power present (again IS-95 with a 15 dB power delta). In both cases, the amplifier is being operated somewhat below its normal operating point (13 dBm output power vs. 27 dBm) so that it is still in gain expansion. The point of this example is that it shows some of the power of S-parameter profiling possible with this measurement technique. Since the modulated power is fixed in frequency while the probe tone sweeps, it is possible to see what behavior an interfering signal would experience at a different frequency. In this case, one can see two gain drop outs at 15 MHz away from the carrier frequency 900 MHz (note that the frequency scale is 10 MHz/div and the modulated power is only ≈1.25 MHz wide). This type of S-parameter profiling could conceivably be useful in studying and/or tailoring out-of-band and band-edge responses.

Figure 15:
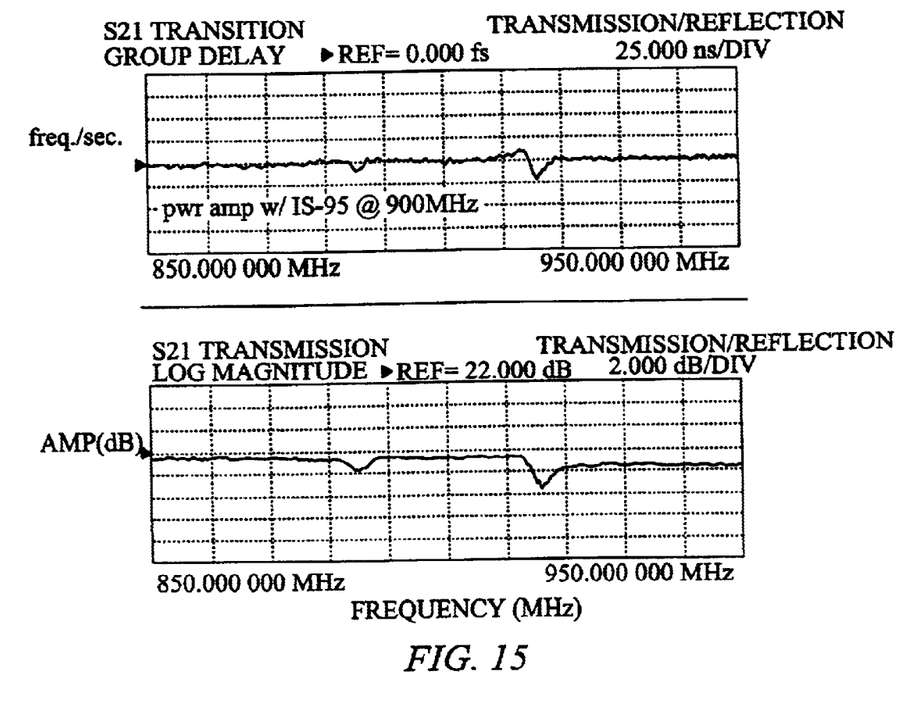
FIG. 15 illustrates the group delay and magnitude measurements for the same test conditions as in FIG. 14.

While FIG. 14 illustrates the difference with and without modulated power applied, FIG. 15 illustrates the group delay ($-d\phi/d\omega$ interpreted as deviation from linear phase) as well as magnitude of the same amplifier under slightly higher drive levels (+17 dBm output power). The group delay deviation (of about 20 ns) can be seen to coincide with the magnitude variation. This type of data is included to illustrate additional profiling power as well as the group delay using the measurement technique of the present invention.

Although the present invention has been described above with particularity, this was merely to teach one of ordinary skill in the art how to make and use the invention. Many additional modifications will fall within the scope of the invention, as that scope is defined by the claims which follow.

What is claimed is:

1. A method for measuring scattering parameters of a device under test (DUT) comprising the steps of:
   providing a stochastic modulated signal as a power tone signal;
   providing a probe tone signal with a power level substantially less than the power tone signal;
   combining the power tone signal and the probe tone signal to provide a composite signal;
   providing the composite signal to the DUT and as a first input to a receiver, the receiver having a narrow measurement bandwidth relative to a bandwidth of the power tone signal;
   providing a signal from the DUT to a second input of the receiver; and
   determining an S-parameter measurement for the DUT using the first and second signals input to the receiver, wherein the probe tone signal does not increase power from the DUT more than 0.2 dB relative to power provided when the power tone signal is provided to the DUT without the probe tone signal.

2. A method for measuring scattering parameters of a device under test (DUT) comprising the steps of:
   providing a stochastic modulated signal as a power tone signal;
   providing a probe tone signal with a power level substantially less than the power tone signal;
   combining the power tone signal and the probe tone signal to provide a composite signal;
   providing the composite signal to the DUT and as a first input to a receiver, the receiver having a narrow measurement bandwidth relative to a bandwidth of the power tone signal;
   providing a signal from the DUT to a second input of the receiver; and determining an S-parameter measurement for the DUT using the first and second signals input to the receiver, wherein the probe tone signal has a power level no greater than 13.3 dB below the power level of the composite signal.

3. A method for measuring scattering parameters of a device under test (DUT) comprising the steps of:

providing a stochastic modulated signal as a power tone signal;

providing a probe tone signal with a power level substantially less than the power tone signal;

combining the power tone signal and the probe tone signal to provide a composite signal;

providing the composite signal to the DUT and as a first input to a receiver, the receiver having a narrow measurement bandwidth relative to a bandwidth of the power tone signal;

providing a signal from the DUT to a second input of the receiver;

determining an S-parameter measurement for the DUT using the first and second signals input to the receiver; and applying ensemble averaging to the first and second signals input to the receiver to statistically enable the power tone signal to be removed from measurement of the composite signals.

4. A method for measuring scattering parameters of the device under test (DUT) comprising the steps of:

providing a stochastic modulated signal as a power tone signal;

providing a probe tone signal with a power level substantially less than the power tone signal;

combining the power tone signal and the probe tone signal to provide a composite signal;

providing the composite signal to the DUT and as a first input to a receiver, the receiver having a narrow measurement bandwidth relative to a bandwidth of the power tone signal;

providing a signal from the DUT to a second input of the receiver; and determining an S-parameter measurement for the DUT using the first and second signals input to the receiver, wherein the power tone signal within the receiver range as averaged from sample measurements has substantially a zero mean.

* * * * *